Oct. 21, 1969 J. M. SCHAEFER 3,474,346

ELECTRONIC RIPPLE FILTER AND AMPLIFIER USED THEREIN

Filed Sept. 15, 1966

INVENTOR
JOHANNES M. SCHAEFER
BY James and Franklin
ATTORNEY

United States Patent Office 3,474,346
Patented Oct. 21, 1969

3,474,346
ELECTRONIC RIPPLE FILTER AND AMPLIFIER USED THEREIN

Johannes M. Schaefer, Wilton, Conn., assignor to Technipower Incorporated, South Norwalk, Conn., a corporation of Connecticut Filed Sept. 15, 1966, Ser. No. 579,724
Int. Cl. H03g *3/30*
U.S. Cl. 330—25 11 Claims

ABSTRACT OF THE DISCLOSURE

Ripple in the output of a DC power supply is greatly reduced by feeding back the output ripple to the input by means of a high gain, fast-acting amplifier in which at least one, and preferably all, of the amplification stages are provided with both DC and AC feedback, thereby to produce an appropriate ripple-cancelling voltage signal.

The present invention relates to means for reducing the ripple content in a voltage signal, and to circuitry particularly well adapted to accomplish that result.

The output from a DC power supply often varies rapidly above and below the desired nominal value. This fluctuation is termed "ripple." The usual way to reduce ripple is to employ filter circuitry formed from static components, but this approach has significant drawbacks. In the first place, a rather large and expensive filter circuit is required, especially when the ripple frequency is on the order of the line frequency. In the second place, a large static filter circuit adversely affects the dynamic stability of the overall system.

It is the prime object of the present invention to devise a system which will remove ripple without adversely affecting the dynamic stability of the overall system, and by means of circuitry which is smaller in size, weight and cost than the type of filter circuits previously employed for this purpose.

That result is accomplished, in accordance with the present invention, by utilizing a dynamic filter circuit which constitutes, in effect, a closed loop system. Means are provided for applying to the ripple-containing output a signal which tends to neutralize the ripple. The resultant modified output is sensed by means of a high gain, fast acting amplifier of novel design, the output of that amplifier controlling the amount of ripple-reduction applied to the output circuit.

It is a further prime object of the present invention to devise a high gain amplifier having a precision and speed of response such that it can be used to control ripple reduction in the manner described above without adversely affecting system stability. To that end, a fully transistorized multi-stage amplifier is employed in which at least one, and preferably all, of the amplification stages are provided with both DC and AC feedback. That transistor which energizes a highly conductive primary winding of a transformer, employed to produce ripple-neutralization, is preferably provided with such DC and AC feedback, thereby to render the transformer more effective in neutralizing the output ripple. In addition, a DC reverse feedback is connected between the output of the amplifier and its input, thereby to ensure that the amplifier reliably operates at an intermediate level such that its output is always very sensitive to ripple-produced changes in its input.

To the accomplishment of the above, and to such other objects as may hereinafter appear the present invention relates to a system for electrically reducing ripple, which system includes a high gain, high speed of response amplifier of novel construction, all as described in the appended claims and as described in this specification taken together with the accompanying drawings in which:

Figures 1, 2:
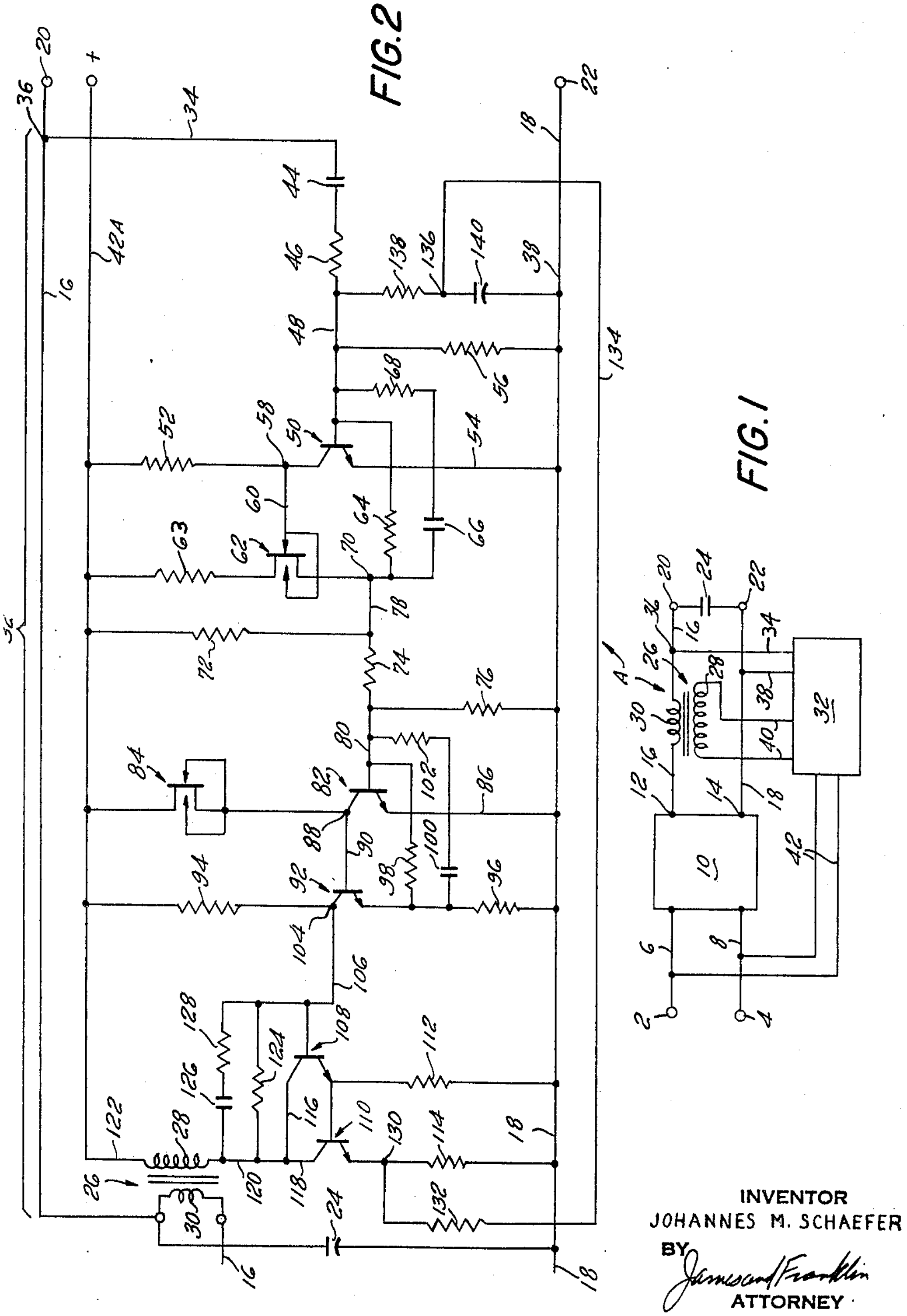
FIG. 1 is a block diagram of the system of the present invention.
FIG. 2 is a circuit diagram of a preferred embodiment of that system, including the aforementioned high gain amplifier.

Having reference first to the block diagram of FIG. 1, a voltage source, DC or AC, is adapted to be connected to terminals 2 and 4. Lines 6 and 8 connect terminals 2 and 4 to the circuit generally designated 10, that circuit having an output at terminals 12 and 14, which output is essentially DC but which output contains a certain amount of undesired voltage ripple. The circuit 10 generally represents a power supply unit producing AC-DC conversion or DC-DC conversion; it will be understood that if the initial voltage source connected to terminals 2 and 4 directly produces the ripple-containing DC, the circuit 10 may be eliminated.

The ripple filter of the present invention, designed to remove the ripple from the DC output across terminals 12 and 14, is generally designated A. It comprises a line circuit comprising leads 16 and 18 which connect the filter input terminals 12 and 14 to filter output terminals 20 and 22 respectively, across which a capacitor 24 may be connected. A ripple-compensating transformer generally designated 26 has a primary winding 28 and a secondary winding 30. The secondary winding 30 is connected in the lead 16 of the filter line circuit between filter input terminal 12 and filter output terminal 20. A high gain, high speed of response amplifier generally designated 32 has an input lead 34 which is connected to point 36 located on lead 16 between the transformer secondary winding 30 and the output terminal 20. A second amplifier input lead 38 is connected to reference voltage lead 18. Thus the input to the amplifier 32 is taken from the ripple filter line circuit after the transformer secondary winding 30 has had its effect. The amplifier 32 is provided with a pair of output leads 40 which are connected to the transformer primary winding 28. Thus a closed control loop is created, the amplifier 32 sensing the ripple at the filter output terminals 20, 22 and applying to the output voltage via the transformer 26 a compensating or ripple-reducing signal, that compensation or ripple reduction taking place in advance of the circuit location to which the amplifier input 12, 14 is connected. The power supply for the amplifier 32 may be provided in any appropriate fashion, as by the leads 42 which are connected to the power input terminals 2 and 4.

The specific circuitry of a preferred embodiment of the amplifier 32 is shown in FIG. 2. The amplifier input lead 34 is connected via capacitor 44, resistor 46, and lead 48 to the base of transistor 50. The collector of the transistor 50 is connected by resistor 52 to positive bias lead 42*a*. Emitter of transistor 50 is connected by lead 54 to the reference voltage potential lead 38, which is in turn connected to reference voltage lead 18. The ripple voltage across the filter output 20, 22 is sensed by the lead 34, deprived of the DC component by the capacitor 44, and appears as a voltage across resistor 56 connected between lead 48 and the reference voltage (hereinafter termed "ground"). The variation in current through the resistor 46 attendant upon changes in the sensed filter output voltage affects the base current for the transistor 50 and hence the control current in the emitter-collector circuit thereof. The magnitude of this current is sensed as a voltage signal at point 58 between resistor 52 and the collector of transistor 50. Point 58 is connected by lead 60 to the field effect transistor 62. The drain electrode of transistor 62 is connected by resistor 63 to the positive bias 42*a*. The source electrode of the field effect transistor 62 is connected to the base of transistor 50 by resistor 64 connected in parallel with a network comprising series-connected capacitor 66 and resistor 68. It will be seen that the field effect transistor 62 is connected to operate as a source follower. The resistor 64 constitutes a DC feedback path to the input or base electrode of the transistor 50, and the capacitor 66 and resistor 68 constitute an AC feedback path thereto. The potential applied to the gate electrode of the field effect transistor 62 affects the current passing through its source-drain circuit, and this is in turn reflected as a voltage signal at point 70 located between the drain electrode on the one hand and the feedback circuits 64 and 66, 68 on the other hand.

Resistors 72, 74 and 76 are connected between the lines 42*a* and 38 so as to function as a voltage divider, the point 70 being connected by lead 78 to one end of the resistor 74, the other end of that resistor being connected by lead 80 to the base of transistor 82. The collector of transistor 82 is connected to positive bias line 42*a* via field effect transistor 84 which constitutes a constant current source. The emitter of transistor 82 is connected ground by lead 86. Point 88 located between the constant current source 84 and the collector of transistor 82 is connected by lead 90 to the base of transistor 92. The collector of transistor 92 is connected by resistor 94 to the positive bias line 42*a*. The emitter of transistor 92 is connected by resistor 96 to ground. Resistor 98 is connected, in parallel with series-connected capacitor 100 and resistor 102, between emitter of transistor 92 and the base of transistor 82. The resistor 98 functions as a DC feedback connection and the capacitor 100 and the resistor 102 function as an AC feedback connection in a manner similar to resistor 64 and capacitor 66—resistor 68 respectively.

Variation in the emitter-collector current of transistor 92 is reflected as a voltage signal at point 104, which is connected by lead 106 to the base of transistor 108. Transistor 108, together with transistor 110 connected thereto in a Darlington connection, constitute the power output stage of the amplifier. The emitters of the transistors 108 and 110 are connected by resistors 112 and 114 respectively to ground. The collectors of the transistors 108 and 110 are connected by leads 116, 118 and 120 to one end of the primary transformer winding 28, the other end thereof being connected by lead 122 to the positive bias line 42*a*. Resistor 124 is connected, in parallel with series-connected capacitor 126 and resistor 128, between the collectors of transistors 108 and 110 and the base of transistor 108, thus constituting respectively DC and AC feedback paths comparable to those provided by the resistor 64 or 98 and the capacitor-resistor networks 66, 68 or 100, 102 respectively.

A DC reverse feedback connection extends from point 130, located between the emitter of transmitter 110 and the resistor 114, and the base of transistor 50. That feedback connection comprises a resistor 132 connected by lead 134 to point 136 located between resistor 138 and capacitor 140, the latter two elements being connected between the base of transistor 50 and ground.

The operation of the circuit described is as follows: Variation in the filter output voltage across terminals 20 and 22, which variation constitutes the ripple to be eliminated, is amplified by transistor 50, thereby controlling field effect transistor 62, which in turn drives transistor 82. Transistor 82 produces a further stage of amplification, which in turn controls the emitter-collector of transistor 92. Transistor 92 acts as a by-pass for the base current provided for the output transistors 108, 110 by the resistor 94; the greater the conductivity of transistor 92, the less base current is provided for the output transistors 108, 110 and hence the less current is provided for the primary transformer winding 28. Variations in the current in the primary winding 28 therefore reflect, on an amplified scale, the ripple signals detected by the amplifier, and they induce in the secondary transformer winding voltages which act in opposition to the ripple and thus tend to neutralize it. The effectiveness of this neutralization is sensed at the filter output terminals 20, 22 and the neutralization signals are modified in accordance therewith in a closed loop control system.

The most serious problem in a control loop system having high gain is dynamic stability. This is particularly the case where the high gain is needed at a relatively high frequency, and in ripple reduction high frequencies are involved; even if the ripple may occur at a power frequency such as sixty cycles per second, its harmonic content is high, and the harmonic frequencies are correspondingly high. The various AC and DC parallel-connected feedback paths provided in the amplifier contribute markedly to the attainment of the desired stability. Resistor 124 and capacitor 126 and resistor 128, connected between the transformer primary winding 28 and the base of transistor 108, to help ensure that the current in lead 106 is more a function of the voltage across the primary winding 28 than of the base current of transistor 108, and this is highly desirable, since it is the primary winding voltage which controls the secondary winding voltage and hence the degree of ripple neutralization. The feedback networks 98, 100 and 102 and 64, 66, 68 contribute greatly to the linearization of the amplification stages with which they are associated.

As the output from the transistors 108 and 110 rises, the feedback to the base of the transistor 50 increases, the transistor 50 becomes more conductive, and as a result, acting through the transistors 62, 82 and 92, the base current to the transistor 108 is somewhat reduced. Thus the DC reverse bias feedback from the amplifier output to the amplifier input ensures that the amplifier is operated below saturation, therefore being effective to produce reduction even when the magnitude of the ripple is very high.

By virtue of the circuitry here disclosed effective ripple compensation is achieved regardless of ripple frequency, amplitude or wave shape, and independently of the power supply for the filter circuit. The amplifier which is employed has an exceptionally high gain, an extremely linear input-output relationship, and a very high speed of response.

While but a single embodiment of the present invention has been here specifically disclosed, it will be apparent that many variations have been made.

I claim:

1. An electronic ripple filter having a line circuit comprising an input to which a voltage supply having a ripple content is adapted to be connected, and an output; a transformer having a primary winding and a secondary winding, said secondary winding being connected in said line circuit between said input and said output; and a high gain amplifier with a high speed of response having an amplifier input and an amplifier output, said amplifier input being connected to said line circuit between said secondary winding and said line circuit output, said amplifier output being connected to said primary winding, in which said amplifier comprises a plurality of amplification stages each having an output and an input, and combined DC and AC feedback connections between said output and said input of at least one of said amplification stages, said combined feedback connections comprising two parallel circuit branches, one branch comprising a capacitor and a resistance in series and the other branch being capacitance-free and comprising a resistance.

2. The filter of claim 1, in which said combined feedback connections are present in at least the last of said amplifier stages.

3. The filter of claim 2, in which said amplifier further comprises a DC reverse feedback connection between said amplifier output and said amplifier input.

4. The filter of claim 1, in which said amplifier comprises an input connected to a first amplifying transistor, said first amplifying transistor having an output connected to a second amplifying transistor, said combined DC and AC feedback connections being between said output and said input of said first transistor, said second transistor having an output connected to a third transistor, said combined DC and AC feedback connections being between said output and said input of said second transistor, said third transistor having an output connected to said primary winding, said combined DC and AC feedback connections being between said output and said input of said third transistor, and a DC feedback connection between said output of said third transistor and said input of said first transistor.

5. The filter of claim 4, in which the output of each of said first and second transistors comprises an additional transistor controlled by the output of said first and second transistors respectively, said additional transistors respectively associated with said first and second transistors having outputs controllingly connected to said second and third transistors respectively, said combined DC and AC feedback connections respectively being connected between the outputs of said additional transistors and the inputs of said first and second transistors respectively associated therewith.

6. An electronic ripple filter having a line circuit comprising an input to which a voltage supply having a ripple content is adapted to be connected, and an output; a transformer having a primary winding and a secondary winding, said secondary winding being connected in said line circuit between said input and said output; and a high gain amplifier with a high speed of response having an amplifier input and an amplifier output, said amplifier input being connected to said line circuit between said secondary winding and said line circuit output, said amplifier output being connected to said primary winding, in which said amplifier comprises a plurality of amplification stages each having an output and an input, and combined DC and AC feedback connections between said output and said input of at least one of said amplification stages, said combined feedback connections being present in at least the last of said amplifier stages.

7. The filter of claim 6, in which said amplifier further comprises a DC reverse feedback connection between said amplifier output and said amplifier input.

8. An electronic ripple filter having a line circuit comprising an input to which a voltage supply having a ripple content is adapted to be connected, and an output; a transformer having a primary winding and a secondary winding, said secondary winding being connected in said line circuit between said input and said output; and a high gain amplifier with a high speed of response having an amplifier input and an amplifier output, said amplifier input being connected to said line circuit between said secondary winding and said line circuit output, said amplifier output being connected to said primary winding, in which said amplifier comprises a plurality of amplification stages each having an output and an input, and combined DC and AC feedback connections between said output and said input of at least one of said amplification stages, said amplifier further comprising a DC reverse feed back connection between said amplifier output and said amplifier input.

9. An electronic ripple filter having a line credit comprising an input to which a voltage supply having a ripple content is adapted to be connected, and an output; a transformer having a primary winding and a secondary winding, said secondary winding being connected in said line circuit between said input and said output; and a high gain amplifier with a high speed of response having an amplifier input and an amplifier output, said amplifier input being connected to said line circuit between said secondary winding and said line circuit output, said amplifier output being connected to said primary winding, in which said amplifier comprises a plurality of amplification stages each having an output and an input, and combined DC and AC feedback connections between said output and said input of at least one of said amplification stages, said amplifier comprising an input connected to a first amplifying transistor, said first amplifying transistor having an output connected to a second amplifying transistor, said combined DC and AC feedback connections being between said output and said input of said first transistor, said second transistor having an output connected to a third transistor, said combined DC and AC feedback connections between said output and said input of said second transistor, said third transistor having an output connected to said primary winding, said combined DC and AC feedback connections being between said output and said input of said third transistor, and a DC feedback connection between said output of said third transistor and said input of said first transistor.

10. The filter of claim 9, in which the output of each of said first and second transistors comprises an additional transistor controlled by the output of said first and second transistors respectively, said additional transistors respectively associated with said first and second transistors having outputs controllingly connected to said second and third transistors respectively, said combined DC and AC feedback connections respectively being connected between the outputs of said additional transistors and the inputs of said first and second transistors respectively associated therewith.

11. A high gain amplifier having a high speed of response comprising an input, an output, and a plurality of amplification stages each having an output and an input, said amplification stages being serially connected between said amplifier input and said amplifier output, and combined DC and AC feedback connections between said output and said input of at least one of said amplification stages, in which a first amplification stage comprises a first transistor, a second amplification stage comprises a second transistor, said first transistor having an output connected to said second transistor, combined DC and AC feedback connections between said output and said input of said first transistor, said second transistor having an output connected to a third transistor, combined DC and AC feedback connections between said output and said input of said second transistor, said third transistor having an output combined DC and AC feedback connections between said output and said input of said third transistor, and a DC feedback connection between said output of said third transistor and said input of said first transistor, and in which the output of each of said first and second transistors comprises an additional transistor controlled by the output of said first and second transistors respectively, said additional transistors respectively associated with said first and second transistors having outputs controllingly connected to said second and third transistors respectively, said DC and AC feedback connections respectively being connected between the outputs of said additional transistors and the inputs of said first and second transistors respectively associated therewith.

References Cited

UNITED STATES PATENTS

| | | | |
|---|---|---|---|
| 2,106,793 | 2/1938 | Burton | 321—10 X |
| 2,630,557 | 3/1953 | Bixby | 321—10 X |
| 2,889,519 | 6/1959 | Montgomery et al. | 330—28 X |
| 3,092,729 | 6/1963 | Cray. | |
| 3,192,483 | 6/1965 | Murray | 330—28 X |
| 3,286,189 | 11/1966 | Mitchell et al. | |
| 3,209,164 | 9/1965 | De Witt | 330—306 XR |
| 3,392,341 | 7/1968 | Burns | 330—35 X |

(Other references on following page)

OTHER REFERENCES

Carapic et al., "An Operational Transistor Amplifier Without Automatic Drift Correction," Electronic Engineering, January 1966, pp. 36–38, 330–26.

Electronic Design, "Product Survey: Field-Effect Transistors, Apr. 26, 1963, pp. 66–69. 330–38FE.

Lowry, "Negative Feedback Transistor Amplifiers," Radio & TV News, May 1957, pp. 55–58. 330–28.

Thompson, "A Very High Input Impedance Buffer Using Field-Effect Transistors," Electronic Engineering, June 1966, pp. 370–373. 330–38FE.

ROY LAKE, Primary Examiner

JAMES B. MULLINS, Assistant Examiner

U.S. Cl. X.R.

321—10; 330—28, 38, 97, 100